United States Patent [19]

Larsen et al.

[11] 4,091,327
[45] May 23, 1978

[54] BROADBAND ISOTROPIC ANTENNA WITH FIBER-OPTIC LINK TO A CONVENTIONAL RECEIVER

[75] Inventors: Ezra B. Larsen, Boulder; James R. Andrews, Lafayette; Eugene E. Baldwin, Longmont, all of Colo.

[73] Assignee: The United States of America as represented by the Secretary of the Army, Washington, D.C.

[21] Appl. No.: 773,585

[22] Filed: Mar. 2, 1977

[51] Int. Cl.² .................. G01R 21/04; G01R 31/00
[52] U.S. Cl. .................................. 324/95; 324/72.5; 324/96; 343/703
[58] Field of Search .............. 324/247, 95, 72, 96, 324/72.5; 325/67; 343/703, 797, 100 AP

[56] References Cited

U.S. PATENT DOCUMENTS

| | | | |
|---|---|---|---|
| 3,461,384 | 8/1969 | Bayati et al. | 324/96 |
| 3,750,017 | 7/1973 | Bowman et al. | 324/72 |

*Primary Examiner*—Rudolph V. Rolinec
*Assistant Examiner*—Ernest F. Karlsen

*Attorney, Agent, or Firm*—Nathan Edelberg; Sheldon Kanars; Edward Goldberg

[57] ABSTRACT

A broadband active isotropic receiving antenna for use with a conventional electromagnetic interference receiver to measure weak near-zone electric fields of unknown polarization. The antenna consists of three mutually orthogonal active dipoles, including RF amplifier circuitry and light emitting diode means, located therein coupled to fiber optic waveguide means. The frequency range of each of the three field components is amplified and used to modulate respective light emitting diodes whose modulated infrared or visible signals are guided through the fiber optic waveguide means to photo-detectors at the far end of the fiber optic guides. These photo-detectors recover the RF modulation from the IR carrier which is then time multiplexed for input to the electromagnetic interference receiver. The DC output from the receiver is processed to provide an output voltage proportional to the square root of the sum of the squares, i.e. the Hermitian magnitude of the three mutually orthogonal electric field components.

16 Claims, 6 Drawing Figures

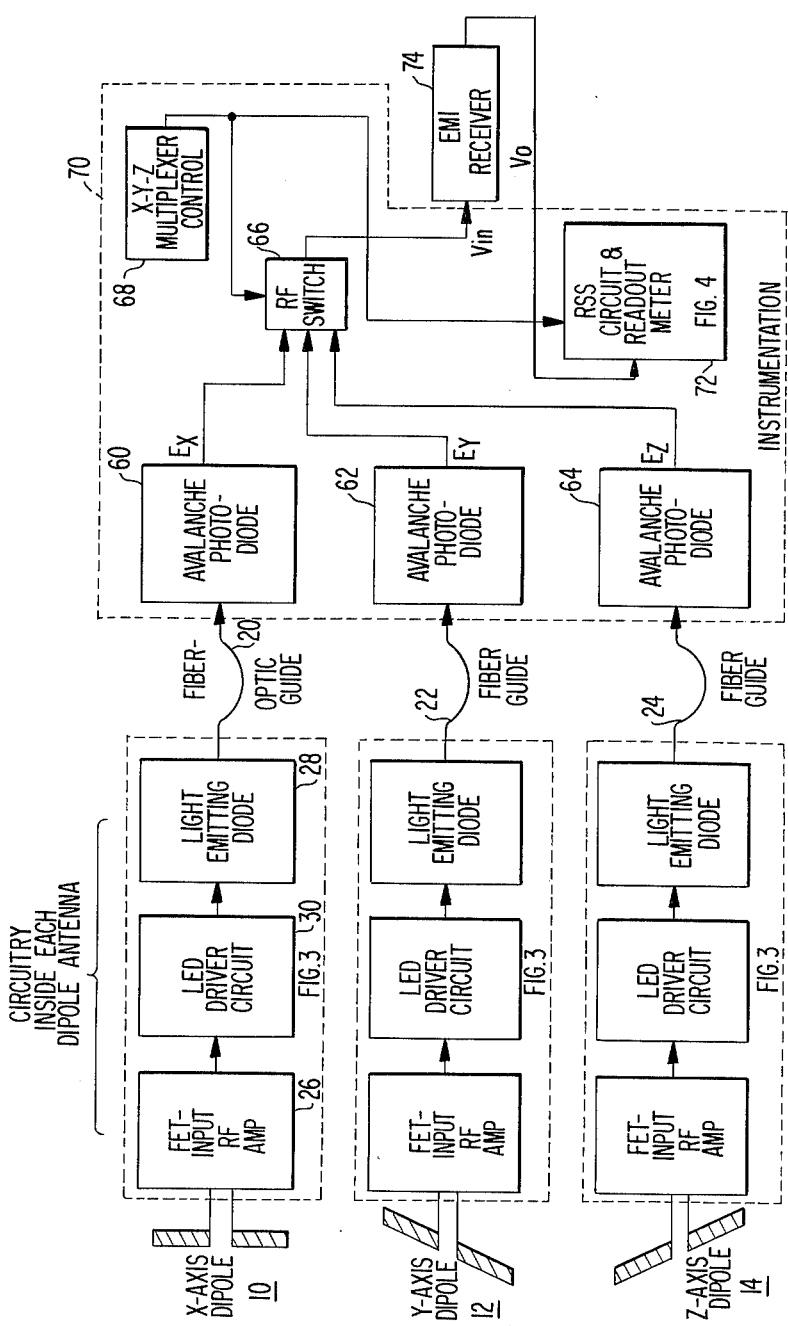
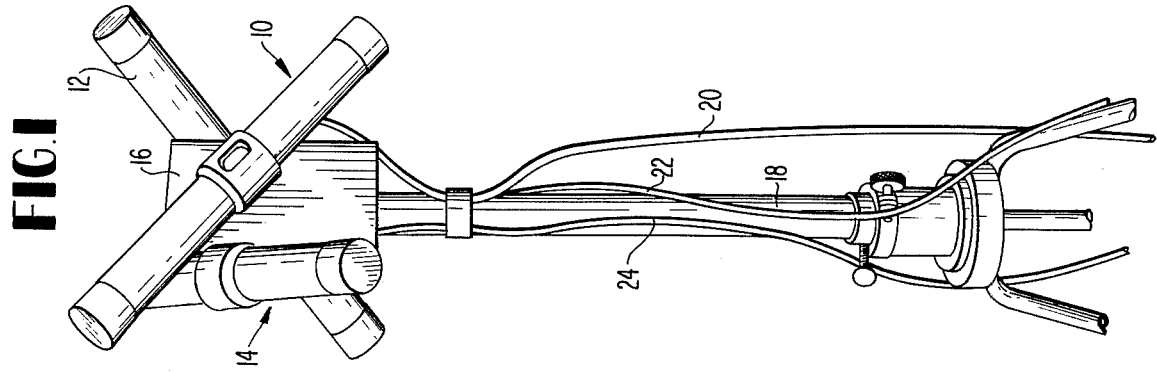

BROADBAND ISOTROPIC ANTENNA WITH FIBER-OPTIC LINK TO A CONVENTIONAL RECEIVER

The invention described herein may be manufactured and used by or for the Government for governmental purposes without the payment of any royalties thereon or therefor.

BACKGROUND OF THE INVENTION

This invention relates generally to electromagnetic field intensity measurement apparatus and more particularly to means for use with a conventional radio receiver to measure weak electromagnetic fields of unknown orientation, for example, leakage emanations from electronic equipment placed within a shielded enclosure.

One typical technique uses a high resistance transmission line such as carbon impregnated plastic to convey the detected antenna signal to a high impedance DC readout meter. This type of probe is often used to map intense fields approaching the hazard level and search for possible interference over a range of 0.1 to 1000 volts per meter. In this type of probe, the composite RF pickup is detected by a diode across the center gap of the dipole; however, no attempt is made to measure the amplitude as a function of frequency. Another technique utilizes an active antenna located in an intense field, suitably coupled to a conventional receiver remotely located from the antenna for measuring the amplitude of the field.

SUMMARY

Briefly, the subject invention is directed to an isotropic antenna system particularly adapted for measuring the amplitude as a function of frequency of near-zone electromagnetic fields and is comprised of three mutually orthogonal active dipole elements, each respectively housing RF amplifier circuitry, a light emitting diode and a diode driver circuit. The electrical field intensity within a predetermined frequency range of each of the three field components is amplified and used to modulate respect light emitting (infrared) diodes located inside the dipole elements. The modulated infrared signals are guided through glass or plastic fiber guides to respective remotely located spectrally matched photo-diodes which recover the field component RF modulation from the IR carrier with the three mutually orthogonal components being multiplexed to the input of the field intensity meter type of apparatus which provides three DC outputs corresponding to the three orthogonal E field components at the measurement point, which are then fed to a signal processing circuit for providing the Hermitian magnitude of the electric fieled under consideration. The isotropic antenna is electrically isolated from the remainder of the instrumentation because the fiber optic links are electrically nonconducting, thus causing no perturbation of the electromagnetic field being sensed.

DESCRIPTION OF THE DRAWINGS

FIG. 1 is a perspective view illustrative of the mutually orthogonal crossed dipole antenna configuration of the subject invention;

FIG. 2 is an electrical block diagram illustrative of the preferred embodiment of the subject invention;

DESCRIPTION OF THE PREFERRED EMBODIMENTS

Figure 3:
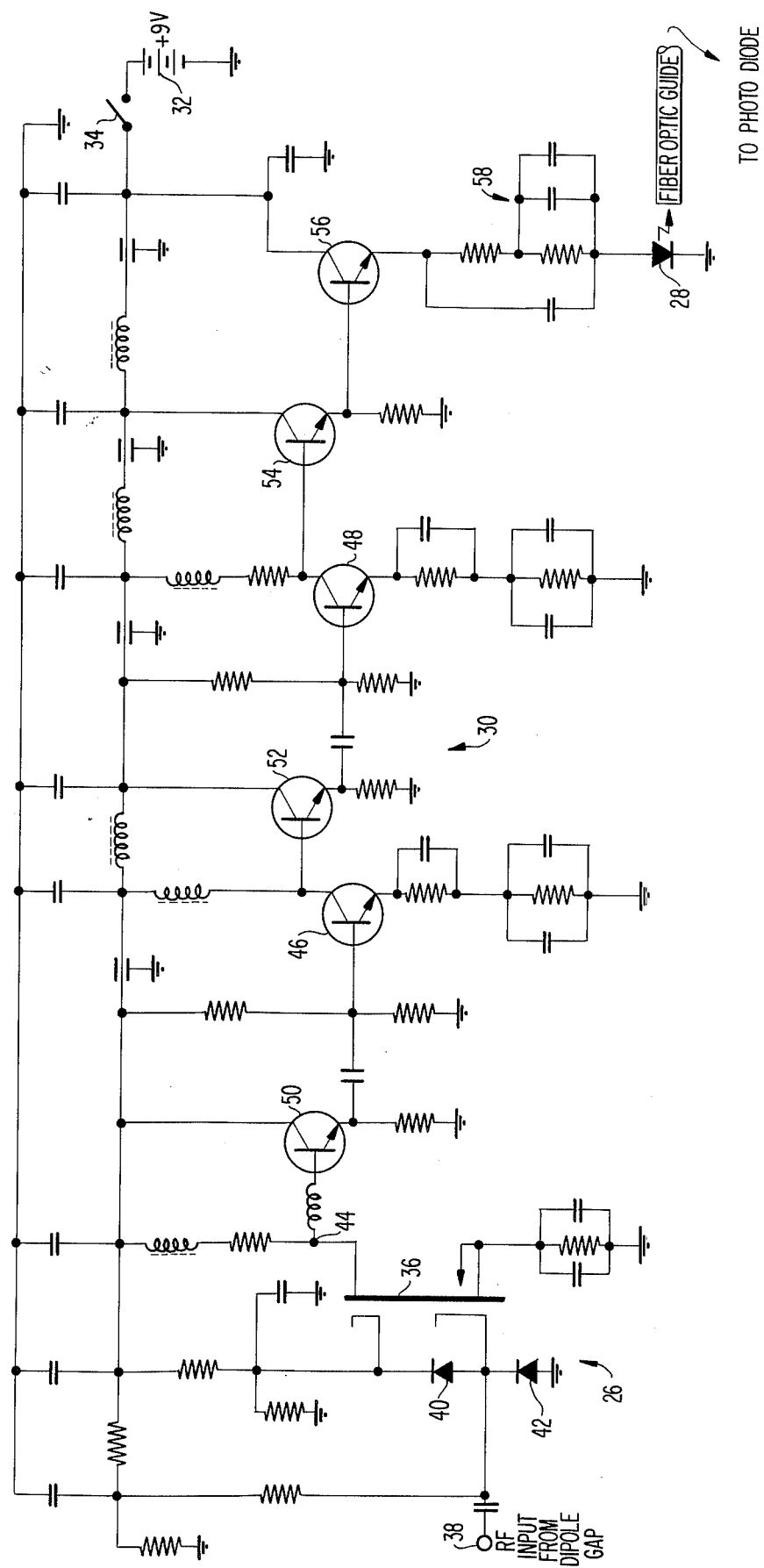
FIG. 3 is an electrical schematic diagram of the circuitry included in each of the mutually orthogonal dipole antenna elements shown in FIG. 1.

Referring now to the drawings and more particularly to FIG. 1, reference numerals 10, 12 and 14 denote three dipole antenna elements having a substantially common center for mutually orthogonal axes defined as the X, Y and Z axes. The three sets of dipole elements are substantially identical in configuration, and respectively consist of a pair of brass hollow tubes 3.0 cm. in diameter, the pair having an overall length of 31 centimeters including a 0.5 centimeter gap therebetween. Each dipole is adapted to be responsive over a frequency range of 10KHz to 200MHz and is thus electrically short rather than self resonant in order to achieve small size and large bandwidth. The three dipoles 10, 12 and 14 are located on a mounting frame 16 which is attached to a generally vertical supporting member 18 such as a tripod in order that the antenna assembly can be suitably positioned for example in a screen room environment for measuring weak unintended RF emanations from electronic equipment under test.

The isotropic antenna configuration shown in FIG. 1 is adapted to include self contained electronic circuit means as set forth in FIGS. 2 and 3, which includes light emitting diodes from which RF modulated infrared emissions are respectively coupled to three fiber optic transmission lines or guides 20, 22 and 24. More particularly, within one of the tubular dipole elements for the three orthogonal axes is a self contained RF input amplifier which is coupled to a forward biased light emitting semiconductor diode (LED) 28 by means of an LED driver circuit 30 as shown in FIG. 2. When desirable, the LED may consist of a laser diode.

The equivalent circuit of each of the dipole antennas 10, 12 and 14 consists of a voltage source in series with a capacitance. The induced open circuit voltage ($V_{oc}$) is approximately equal to the product of the field strength E sensed and the half-dipole length. The amplitude of the RF input ($V_{in}$) to the RF input amplifier 26 is reduced by capacitance-voltage driver effect as given by the equation:

$$V_{in} = V_{oc}[C_a/(C_a + C_s)] \quad (1)$$

where $C_a$ is the antenna source capacitance, and $C_s$ is the total shunt capacitance.

Because the induced signal currents in the dipole antennas 10, 12 and 14 are at right angles to each other, the current on one dipole does not induce an unbalanced potential across the gaps of the other two dipoles. An effective field strength magnitude approximately at the common center of the three mutually orthogonal dipoles can be defined as the scaler quantity:

$$|E| = \sqrt{E_x^2 + E_y^2 + E_z^2} \qquad (2)$$

where $|E|$ is the Hermitian magnitude of the electric field and $E_x$, $E_y$ and $E_z$ are the amplitudes of the three field components existing along the X, Y, Z axes along which the three sets of dipoles are oriented.

Due to the fact that an infrared (IR) carrier is theoretically capable of transmitting a relatively large signal bandwidth and since the line loss vs. signal frequency is essentially constant due to the fact that the RF modulation frequency is such a small percentage of the IR carrier frequency, the present invention employs a light emitting diode (LED) 28 which is adapted to be modulated directly and easily by varying the forward current through the diode with the RF signal simply being superimposed on the DC bias current. This circuit is shown in specific detail in FIG. 3.

Referring now to FIG. 3, the bias current for the light emitting diode 28 is adapted to be supplied from a DC battery source 32 located within the dipole element which is coupled to the circuitry via a single pole switch 34. The RF input amplifier 26 is shown consisting of conventional MOSFET amplifier 36 capacitively coupled to an input terminal 38 coupled to the respective antenna elements and being protected by a pair of diodes 40 and 42. The deteted RF signal which appears at circuit junction 44 is amplified through two stages of amplification provided by means of transistors 46 and 48 together with the emitter follower circuits including transistors 50, 52 and 54 and the circuit components associated therewith. The biasing current for the light emitting diode 28 is applied from the battery source 32 through the emitter-collector junction of a transistor 56 whose conductivity is controlled by means of the signal applied to its base from the emitter-follower 54 and the resistance-capacitance coupling circuitry 58.

Referring now back to FIG. 2, the IR output from the light emitting diode 28 for example, is coupled to a fiber optic guide 20. Transmission of light inside a fiber is by a process of mulitple internal reflections. In a manner similar to RF waveguides, an optical fiber can propagate either in a single mode if the diameter is small enough or in many modes. A typical single-mode fiber for IR wavelengths has a core diameter of about 2 micrometers, surrounded by a thicker cladding. This type of fiber has the lowest loss, but the small core size makes it difficult to couple energy into the fiber. On the other hand, multi-mode fibers have a core diameter on the order of 100 micrometers. This permits easier coupling to less expensive sources such as LEDs. However, the different modes propagate with different velocities, causing a reduction in the usable modulation frequency. In spite of this limitation, large multi-mode fibers are preferable with the light emitting diode 28.

Coupled to the opposite ends of the three fiber optic guides 20, 22 and 24, is a respective silicon avalanche photodiode (APD) 60, 62 and 64, which is spectrally matched with light emitting diode 28 coupled thereto. When desirable, the photo-diode may be in a PIN diode. Each of the photo-diodes operate to demodulate the IR signal carried in the respective fiber optic guide. This type of semiconductor photo-detector is operated with a high reverse bias voltage in a manner well known to those skilled in the art. As the bias approaches the breakdown voltage, hole-electron pairs are created by the absorbed IR photons, generating additional pairs. Avalanche multiplication produces a current gain on the order of 100. There is, however, an optimum bias voltage which results in sufficient gain and maximum signal to noise ratio. This optimum value is determined experimentally for each length and type of fiber guide and for each set of operating conditions.

Silicon avalanche photo-diodes for detector use are commercially available with gain bandwidth products up to 100GHz. For an avalanche gain on the order of 100, the attainable signal bandwidth is thus 1GHz. It is evident that such photo-diodes are not the limiting factor in achieving large bandwidth in a fiber optic system. The upper usable frequency in the subject invention is for practical purposes limited by the carrier lifetime of the light emitting diode material of the diodes 28. It should also be pointed out, however, that when desirable, heterodyne coversion employing an RF local oscillator inside the active dipole could be used to achieve still higher effective signal frequencies.

Each of the avalanche photo-diodes 60, 62 and 64 shown in FIG. 2 provide output signals corresponding to the component RF signals $E_x$, $E_y$ and $E_z$, respectively, of the unknown $E$ field being sensed. These signals are fed to an RF switch 66, which provides a multiplexed output, i.e. a consecutive output of the signals $E_x$, $E_y$ and $E_z$ in response to control signals provided by a timing circuit 68 shown in the drawing as being the X-Y-Z multiplex control section. The multiplex control section 68 as well as the RF switch 66 and the detector photo-diodes 60, 62 and 64, are included in a remotely located control unit 70 which additionally includes a root-sum-square signal processor circuit and readout meter 72 which is shown in detail in FIG. 4. The multiplexed RF output of the RF switch 66 is fed as $V_{in}$ to receiver apparatus 74 which is adapted to be responsive to RF signals of the type sought to be detected and measured. Such apparatus may be, for example, a commercially available Fairchild Interference Analyzer model EMC-25. Such apparatus provides a DC output for the RF input and as such three DC voltages corresponding to signals $V_o = E_x$, $E_y$ and $E_z$ are applied in sequence to the signal processor circuitry 72.

Figure 4:
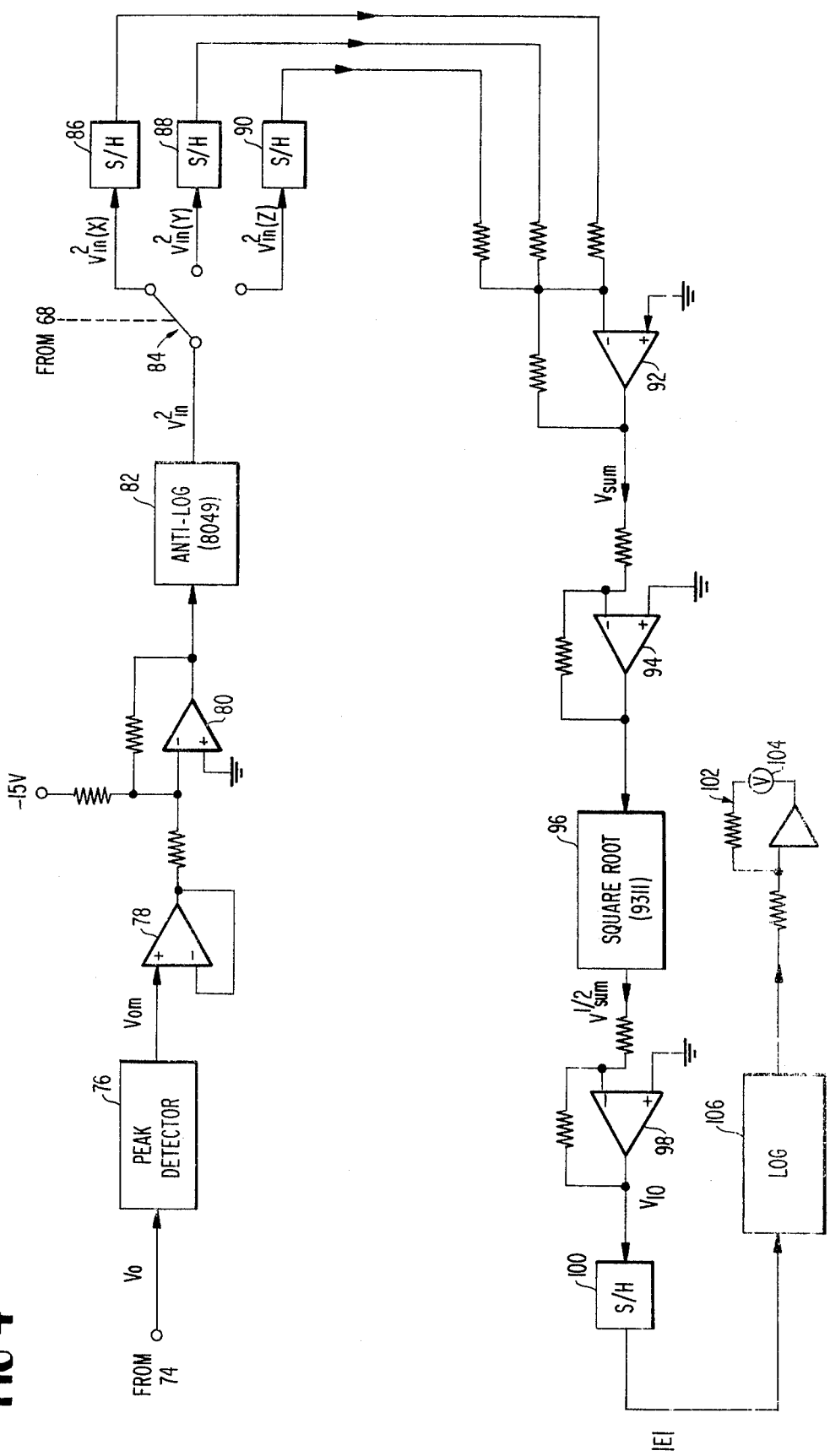
FIG. 4 is an electrical block diagram illustrative of the signal processing circuitry utilized by the subject invention.

Referring now to FIG. 4, the DC signal $V_o$ is applied to a peak detector circuit 76 which provides an output $V_{om} = V_o(max)$. This signal is fed through a buffer amplifier 78 to an inverting amplifier and DC level shifter circuit 80 and then to an anti-logarithm integrated circuit module 82 e.g. a 8049 I.C. module which is adapted to extract a signal voltage proportional to $V_{in}^2$ where, for example, $V_o$ is in fact proportional to log $V_{in}$. Next by means of a multiplex switch 84 controlled by the control section 68, the three signals $V_{in}^2(X)$, $V_{in}^2(Y)$, and $V_{in}^2(Z)$ are respectively stored in three separate sample and hold circuits 86, 88, and 90, which circuits are well known to those skilled in the art. These signal voltages are algebraically added in the summing amplifier 92 to provide a signal voltage $V_{sum} = V_{in}^2(X) + V_{in}^2(Y) + V_{in}^2(Z)$ which is then fed through a signal inverter stage 94 to an analog multiplier 96 which may be, for example, a type 9311 integrated circuit module which is operable to perform the square root operation on the voltage $V_{sum}$. The $V_{sum}^{\frac{1}{2}}$ output from the multiplier 96 is fed via an inverter 98 to a fourth sample and hold circuit 98 whose output is a DC voltage proportional to the Hermitian magnitude of the E field. This voltage is then fed to a metering circuit 102 including a meter 104 having, for example, a linear scale which by means of a logarithmic circuit 106 provides an output signal reading in terms of dB$\mu$V.

Figure 5:
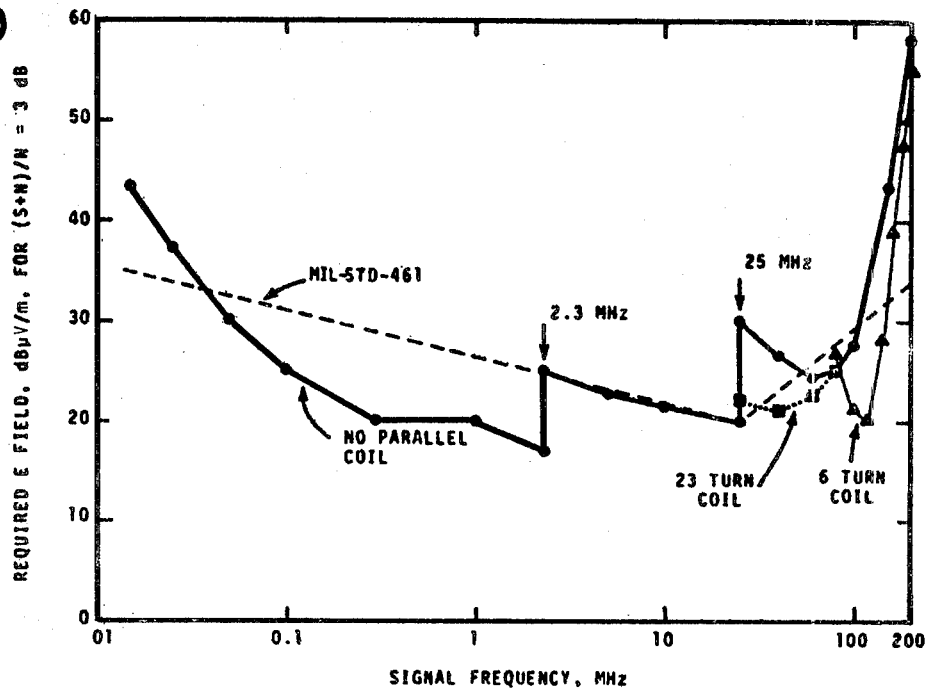
FIG. 5 is a graph illustrative of the tangential sensitivity of the dipole and fiber optic link employed by the subject invention.
Figure 6:
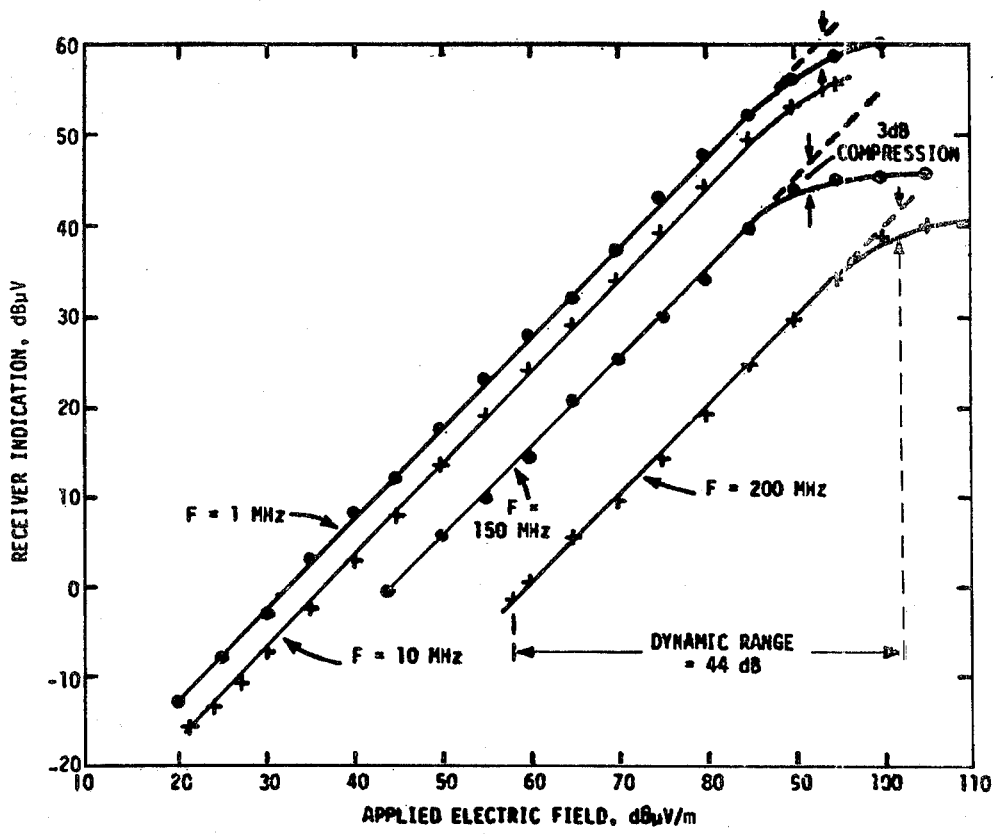
FIG. 6 is a graph including a plurality of performance curves of the system according to the subject invention for a plurality of discrete signal frequencies of operation.

Insofar as the operational characteristics of the subject invention is concerned, FIG. 5 is ilustrative of the tangential sensitivity of the dipole antenna and fiber optic system in combination disclosed above whereupon the length of the fiber guide is approximately 10 meters, the diode current of LED 28 is 16 milliamperes, and the APD current is approximately 40 microamperes. Also, low Q coils are connected across the center gap of each dipole to provide a broad antenna resonance, producing a significant improvement in the overall sensitivity in any desired frequency band. With respect to FIG. 6, on the other hand, it discloses the overall preformance of the fiber optic dipole system at RF signal frequencies of 1MHz, 10MHz, 150MHz and 200MHz with the curves being indicative of the receiver outputs measured for applied electric field values between the ranges of 20 and 100 dB $\mu$V/m.

Thus what has been shown and described is a sensitive, isotropic electrically-isolated antenna system adapted for field intensity measurements of weak emanations in a controlled environment such as a shielded room. The infrared system described utilizing light emitting diode sources, multi-mode glass fiber transmission lines and avalanche photo-diode detectors provide operational improvement heretofore unavailable with the present state of the art apparatus.

Having thus shown and disclosed what is at present considered to be the preferred embodiment of the subject invention, we claim:

1. A field intensity measuring system particularly adapted for near-zone electromagnetic fields comprising in combination:
 a plurality of mutually orthogonal electrically short dipole antennas responsive to a respective orthogonal RF field component of a field of unknown polarization, each dipole antenna including respective first electrical circuit means interiorly thereof;
 said first circuit means including RF amplifier circuit means coupled to its respective dipole antenna for amplifying the RF field component sensed thereby, and optical energy generating means coupled to said RF amplifier circuit means, said generating means providing an optical carrier output signal which is modulated by the amplified RF signal provided by said RF amplifier circuit means;
 respective optical carrier guide means coupled to said optical energy generating means;
 respective photo-detector means coupled to said optical carrier guide means and being operable to demodulate the RF modulated optical carrier signal translated thereby to provide respective field component RF signals;
 second circuit means coupled to said field component RF signals and being operative to provide a respective measured value signals thereof; and
 third circuit means coupled to said second circuit means and being operative to process said measured values signals of said field component RF signals to provide a composite measured value signal indicative of the effective field intensity in the proximate region of said dipole antennas.

2. The system as defined by claim 1 wherein said plurality of mutually orthogonal dipole antennas comprises three dipole antennas, each consisting of a pair of tubular elements one of which includes a space for housing said first circuit means.

3. The system as defined by claim 2 wherein said tubular elements are generally cylindrical in shape.

4. The system as defined by claim 2 wherein said optical energy generating means comprises a light emitting diode.

5. The system as defined by claim 4 wherein said first circuit means additionally includes driver circuit means coupled between said light emitting diode and said RF amplifier circuit means.

6. The system as defined by claim 5 wherein said RF amplifier circuit means includes a MOSFET semiconductor device having input means coupled to said antenna and output means coupled to said driver circuit means.

7. The system as defined by claim 4 wherein said light emitting diode comprises a semiconductor diode.

8. The system as defined by claim 4 wherein said light emitting diode comprises a laser diode.

9. The system as defined by claim 4 wherein said photo-detector means comprises a photo-diode spectrally matched to said light emitting diode.

10. The system as defined by claim 4 wherein said photo-detector means comprises a semiconductor avalanche photodiode spectrally matched to said light emitting diode.

11. The system as defined by claim 4 wherein said photo-detector means comprises a semiconductor PIN diode spectrally matched to said light emitting diode.

12. The system as defined by claim 2 wherein said optical carrier guide means comprises fiber optic guide means.

13. The system as defined by claim 2 wherein said second circuit means comprises multiplexed RF switch means coupled to said photo-detector means for providing a timed sequence of field component RF signals and radio receiver means coupled to said RF switch means to provide a timed sequence of DC measured value signals.

14. The system as defined by claim 13 wherein said third circuit means is responsive to the timed sequence of DC measured value signals from said receiver means and including means for computing and providing an output signal of the square root of the sum of the squares value of the DC measured value signals to provide the Hermitian magnitude of the field components sensed.

15. The system as defined by claim 14 wherein said third circuit means is sychronized with said multiplexed RF switch means and includes multiplex switch means coupled to said DC measured value signals from said receiver means.

16. The system as defined by claim 15 and additionally including means for providing a visual indication of the value of the square root of the sum of the squares value output signal.

* * * * *